United States Patent
Barman et al.

(10) Patent No.: US 10,839,877 B1
(45) Date of Patent: Nov. 17, 2020

(54) REGISTER PROTECTION CIRCUIT FOR HARDWARE IP MODULES

(71) Applicant: NXP USA, INC., Austin, TX (US)

(72) Inventors: Arun Kumar Barman, Faridabad (IN); Parul Bansal, Delhi (IN); Jhalak Gupta, Gwalior (IN)

(73) Assignee: NXP USA, INC., Austin, TX (US)

( * ) Notice: Subject to any disclaimer, the term of this patent is extended or adjusted under 35 U.S.C. 154(b) by 0 days.

(21) Appl. No.: 16/392,427

(22) Filed: Apr. 23, 2019

(51) Int. Cl.
  *G11C 7/24* (2006.01)
  *G06F 12/0882* (2016.01)
  *G06F 11/10* (2006.01)
  *G11C 16/22* (2006.01)

(52) U.S. Cl.
  CPC .......... *G11C 7/24* (2013.01); *G06F 11/1064* (2013.01); *G06F 12/0882* (2013.01); *G11C 16/22* (2013.01)

(58) Field of Classification Search
  CPC ....... G11C 7/24; G11C 16/22; G06F 11/1064; G06F 12/0882
  See application file for complete search history.

(56) References Cited

U.S. PATENT DOCUMENTS

| | | | | |
|---|---|---|---|---|
| 4,777,588 A * | 10/1988 | Case | ................ | G06F 9/462 712/41 |
| 5,414,864 A * | 5/1995 | Koizumi | ............ | G06F 9/461 711/E12.099 |
| 5,568,380 A * | 10/1996 | Brodnax | ........ | G01R 31/318533 700/79 |
| 5,592,641 A * | 1/1997 | Fandrich | ................. | G11C 7/24 365/185.04 |
| 6,026,479 A * | 2/2000 | Fisher | ................ | G06F 9/30076 712/215 |
| 6,339,823 B1 * | 1/2002 | Loper, Jr. | ............. | G06F 9/3013 711/165 |
| 6,779,099 B2 | 8/2004 | Hou | | |
| 10,007,522 B2 * | 6/2018 | Scott | .................... | G06F 9/3806 |
| 2003/0159057 A1 | 8/2003 | Mangold et al. | | |
| 2004/0257883 A1 * | 12/2004 | Byeon | ..................... | G11C 7/24 365/195 |
| 2008/0059808 A1 | 3/2008 | Engler et al. | | |
| 2008/0263256 A1 * | 10/2008 | Gudeth | ................ | G06F 12/145 711/2 |

(Continued)

FOREIGN PATENT DOCUMENTS

CN  105138929  12/2015

*Primary Examiner* — Ramon A. Mercado (57) ABSTRACT

A protection module for an electronic circuit prevents unintended write operations by a master module to functional registers of a protected module. The protection module includes soft lock bits (SLBs) that indicate whether corresponding functional registers are locked and control logic that supports (i) a page select (PS) control parameter that indicates whether access by the master module is to the functional registers or the SLBs and (ii) a mode select (MS) control parameter that indicates whether access by the master module to the functional registers is in a normal access mode, in which each written-to functional register is left unlocked, or an auto-lock access mode, in which each just-written-to functional register is automatically locked by setting the corresponding SLB. The functional registers and the SLBs share addresses that can fit within a single address space that includes the control parameters.

11 Claims, 9 Drawing Sheets

(56) References Cited

U.S. PATENT DOCUMENTS

| | | | |
|---|---|---|---|
| 2009/0049331 A1* | 2/2009 | Blome | G06F 11/261 |
| | | | 714/3 |
| 2009/0089526 A1* | 4/2009 | Kuo | G06F 21/79 |
| | | | 711/163 |
| 2009/0103362 A1 | 4/2009 | Pekny et al. | |
| 2010/0138576 A1* | 6/2010 | Goerlich | G06F 13/4291 |
| | | | 710/110 |
| 2010/0321394 A1* | 12/2010 | Shinomiya | G06T 1/20 |
| | | | 345/501 |
| 2012/0072734 A1 | 3/2012 | Wishman et al. | |
| 2014/0146067 A1 | 5/2014 | Doddapuneni et al. | |
| 2015/0089202 A1* | 3/2015 | Qiu | G06F 9/3887 |
| | | | 712/218 |
| 2019/0213121 A1* | 7/2019 | Yamauchi | G06F 12/0246 |
| 2019/0278516 A1* | 9/2019 | Rowley | G06F 3/0622 |

* cited by examiner

| HLB | UAA | MS | PS | ASE | Description |
|---|---|---|---|---|---|
| 0 | 0 | 0 | 0 | 0 | Supervisor access (read/write) to Functional registers, no automatic lock on write, No switching of register page on write |
| 0 | 0 | 0 | 0 | 1 | Supervisor access (read/write) to Functional registers, no automatic lock on write, Automatic switching to SLB page on write, PS bit toggles to 1 |
| 0 | 0 | x | 1 | 0 | Supervisor access (read/write) to SLB registers, No switching of register page on write |
| 0 | 0 | 0 | 1 | 1 | Supervisor access (read/write) to SLB registers, no automatic lock on write, Automatic switching to functional registers on write, PS bit toggles to 0 |
| 0 | 0 | 1 | 1 | 1 | Supervisor access (read/write) to SLB registers, with automatic lock on write, Automatic switching to functional registers on write, PS bit toggles to 0 |
| 0 | 0 | 1 | 0 | 0 | Supervisor access (read/write) to Functional registers, automatic lock on write, No switching of register page on write |
| 0 | 0 | 1 | 0 | 1 | Supervisor access (read/write) to Functional registers, automatic lock on write, Automatic switching to SLB page on write, PS bit toggles to 1 |
| 0 | 1 | 0 | 0 | 0 | User and Supervisor access (read/write) to Functional registers, no automatic lock on write, No switching of register page on write |
| 0 | 1 | 0 | 0 | 1 | User and Supervisor access (read/write) to Functional registers, no automatic lock on write, Automatic switching to SLB page on write, PS bit toggles to 1 |
| 0 | 1 | x | 1 | 0 | User and Supervisor access (read/write) to SLB registers, No switching of register page on write |
| 0 | 1 | 0 | 1 | 1 | User and Supervisor access (read/write) to SLB registers, no automatic lock on write, Automatic switching to functional registers on write, PS bit toggles to 0 |
| 0 | 1 | 1 | 0 | 0 | User and Supervisor access (read/write) to Functional registers, automatic lock on write, No switching of register page on write |
| 0 | 1 | 1 | 0 | 1 | User and Supervisor access (read/write) to Functional registers, automatic lock on write, Automatic switching to SLB page on write, PS bit toggles to 1 |
| 1 | 0 | x | 0 | X Forced (0) | Supervisor access (read/write) to functional registers (Write allowed only to the unlocked and unprotected registers) |
| 1 | 0 | x | 1 | X Forced (0) | Supervisor access (read) to Soft Lock bit registers allowed |
| 1 | 1 | x | 0 | X Forced (0) | User and Supervisor access (read/write) to functional registers (Write allowed only to the unlocked and unprotected registers) |
| 1 | 1 | x | 1 | X Forced (0) | User and Supervisor Read access to Soft Lock bit registers allowed |

REGISTER PROTECTION CIRCUIT FOR HARDWARE IP MODULES

BACKGROUND

The present invention relates generally to electronic circuits and, more particularly, to techniques for preventing unintended write operations to functional registers of hardware IP modules.

Figure 1:
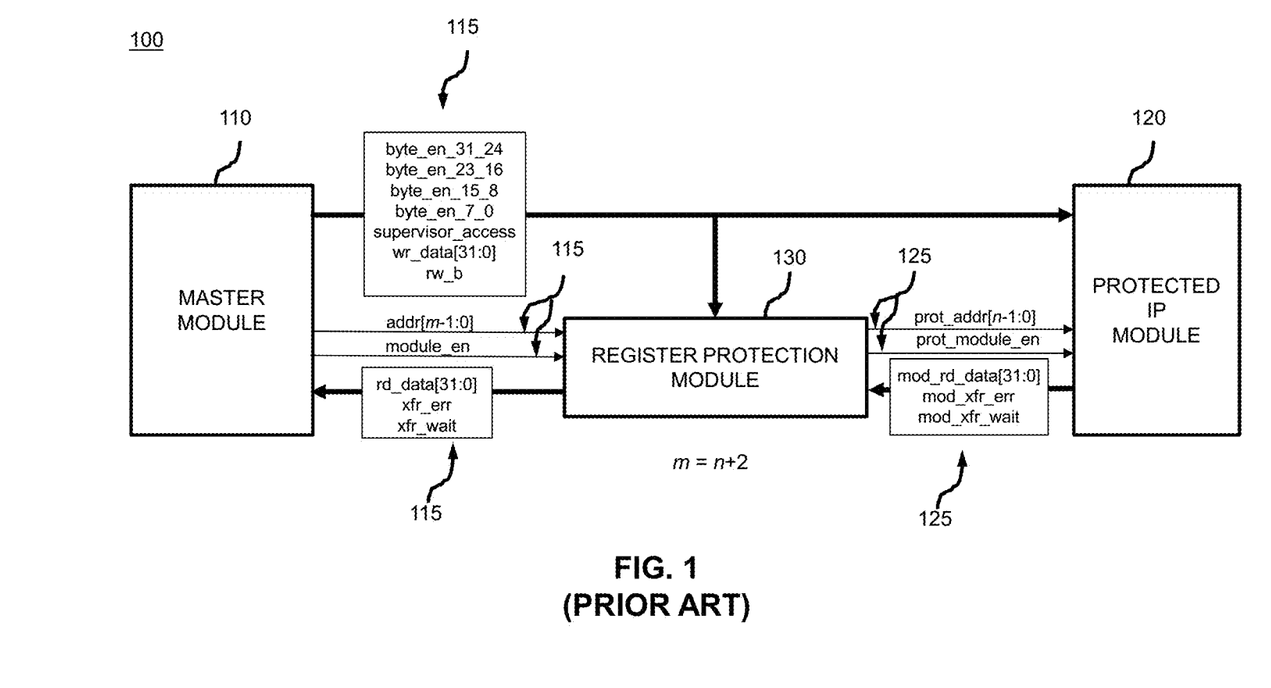
FIG. 1 is a simplified block diagram of a conventional electronic system.

FIG. 1 is a simplified block diagram of a conventional electronic circuit 100 having a master module 110 that can write data to and read data from the functional registers (not shown in FIG. 1) of a hardware IP module 120 via an access bus 115. In addition, the circuit 100 has a register protection module 130 that prevents the master module 110 from performing unintended write operations to selectively locked functional registers in the protected module 120. The master module 110 communicates with the IP module 120 and the protection module 130 via the access bus 115, and the protection module 130 communicates with the IP module 120 via a dedicated bus 125.

Although not shown in FIG. 1, for each functional register in the IP module 120, the protection module 130 has a soft lock bit (SLB) register that indicates whether or not write operations to that functional register are enabled. In some implementations, each SLB corresponds to an 8-bit (i.e., byte size) functional register. To protect a functional register in the IP module 120 from an unintended write operation, the corresponding SLB in the protection module 130 is set (i.e., to logic value 1), thereby locking the functional register. To enable a write operation to a locked functional register in the IP module 120, the corresponding SLB in the protection module 130 is reset (to logic value 0), thereby unlocking the functional register.

Whenever the protection module 130 determines that the master module 110 is attempting to write data to a functional register in the IP module 120, the protection module 130 checks the value of the SLB corresponding to that functional register to determine whether or not to allow the write operation to be executed. If the SLB is set, then the protection module 130 determines that the write instructions were unintended and prevents the write operation from being executed. If the SLB is not set, then the protection module 130 assumes that the write instructions were intended and allows the write operation to be executed.

If and when the master module 110 wants to perform an intentional write operation to a locked functional register, the master module 110 must first send a command to reset the corresponding SLB in the protection module 130 in order to unlock the functional register and then send a command for the write operation to the now-unlocked functional register. The protection module 130 will receive and execute the reset command to reset the SLB. The protection module 130 will then receive the write command, check the SLB and determine that the functional register is unlocked, and allow the write command to be executed.

The protection module 130 supports two different types of write operations to the functional registers in the IP module 120: a write-without-lock operation and a write-with-lock operation. In a write-without-lock operation, the protection module 130 allows the master module 110 to write to an unlocked functional register having a reset SLB, where the protection module 130 leaves the SLB reset and the functional register unlocked. In a write-with-lock operation, the protection module 130 allows the master module 110 to write to an unlocked functional register having a reset SLB, where the protection module 130 then automatically sets the SLB, thereby locking the functional register.

Figure 2:
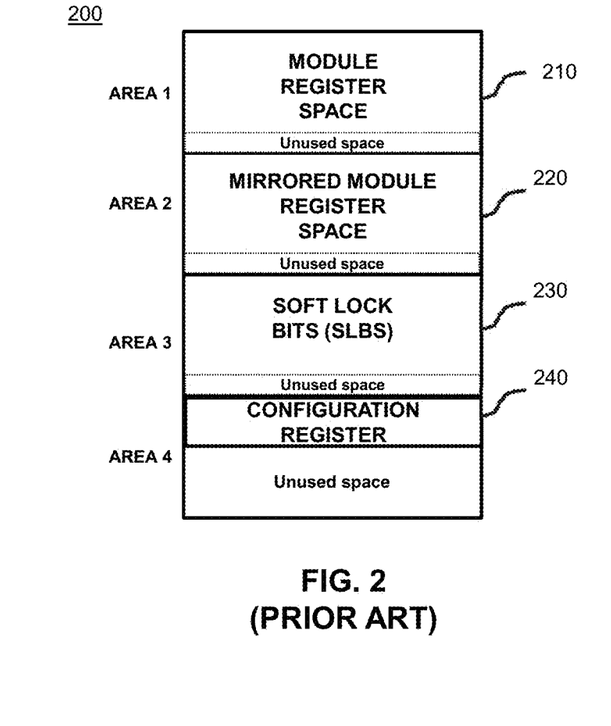
FIG. 2 is a representation of a memory map of the IP module and the protection module of FIG. 1.

FIG. 2 is a representation of a conventional memory map 200 of the IP module 120 and the protection module 130 of FIG. 1. The first area represents a module register address space 210 associated with the functional registers in the IP module 120 for the write-without-lock operations. The second area represents a mirrored module register address space 220 associated with the functional registers in the IP module 120 for the write-with-lock operations. Note that the address of each functional register in the first area 210 differs from the address of the same functional register in the second area 220 only in one or more of their MSBs (most significant bits). The number of differing MSBs depends on the size of the first and second areas. These MSBs are consumed by the protection module 130 to determine the appropriate area in the memory map 200 and are not sent to the IP module 120.

To request a write-without-lock operation to an unlocked functional register in the protected module 120, the master module 110 uses the address for that functional register in the module register space 210. To request a write-with-lock operation to an unlocked functional register, the master module 110 uses the address for that functional register in the mirrored module register space 220.

When the protection module 130 receives a write command to an unlocked functional register, the protection module 130 analyzes the MSBs of the address addr to determine whether the write command is for a write-without-lock operation or a write-with-lock operation. For the memory map 200, the addresses in the module register space 210 are identical to the actual addresses of the functional registers in the IP module 120, so when the address addr for a write command is in the mirrored module register space 220, the protection module 130 translates that address to the corresponding address prot_addr in the module register space 210. Note that, when the address addr is in the module register space 210, no translation is required and the protection module 130 sets prot_addr equal to addr.

Referring again to FIG. 2, the third area represents the address space 230 associated with the SLBs in the protection module 130, and the fourth area represents the address space 240 associated with a general configuration register (GCR) that stores certain control parameters used by the protection module 130 (e.g., HLB and UAA as described further below in relation to FIG. 4).

In a typical implementation of the conventional electronic circuit 100, the size of the address space for the IP module 120 must be preserved in an integer power of two (e.g., 1 KB, 2 KB, 4 KB, etc.). Assume, for example, that the functional registers in the IP module 120 have a size of 1 KB. In that case, 4 KB of address space are needed in the memory map 200 to support the 1 KB of functional registers, that is, four times the size of the functional registers.

In the conventional circuit 100, the sizes of the SLBs and the GCR are smaller than the size of the corresponding functional registers. Additionally, the total address space always needs to be aligned at a 4 KB boundary. As such, if the sum of all of the sections of the memory map 200 is less than an integer multiple of 4 KB, then padding is added to align the memory map 200 to next integer multiple of 4 KB. With the above constraints on functional registers having sizes ranging from 1 KB to 32 KB, the size of the memory map 200 varies from 4 to 2.4 times the size of the functional registers. For example, for functional registers having a size of 2 KB, the memory map would need 8 KB of address space: 2 KB for the module register space 210, 2 KB for the mirrored module register space 220, 0.5 KB for the SLBs 230, and 3.5 KB for the GCR 240, which is, four times the size of the functional registers. For larger and larger functional registers up to 32 KB, the memory map still requires 76 KB of address space: 32 KB for the module register space 210, 32 KB for the mirrored module register space 220, 8 KB for the SLBs 230, and 4 KB for the GCR 240 or about 2.4 times the size of the functional registers. Thus, it would be desirable to have a technique for protecting functional registers from unintended write operations that uses less address space than the conventional technique of FIGS. 1 and 2.

BRIEF DESCRIPTION OF THE DRAWINGS

Embodiments of the present invention are illustrated by way of example and are not limited by the accompanying figures, in which like references indicate similar elements. Elements in the figures are illustrated for simplicity and clarity and have not necessarily been drawn to scale. For example, the thicknesses of layers and regions may be exaggerated for clarity.

DETAILED DESCRIPTION

Detailed illustrative embodiments of the present invention are disclosed herein. However, specific structural and functional details disclosed herein are merely representative for purposes of describing example embodiments of the present invention. Embodiments of the present invention may be embodied in many alternative forms and should not be construed as limited to only the embodiments set forth herein. Further, the terminology used herein is for the purpose of describing particular embodiments only and is not intended to be limiting of example embodiments of the invention.

As used herein, the singular forms "a", "an", and "the", are intended to include the plural forms as well, unless the context clearly indicates otherwise. It further will be understood that the terms "comprises", "comprising", "has", "having", "includes", or "including" specify the presence of stated features, steps, or components, but do not preclude the presence or addition of one or more other features, steps, or components. It also should be noted that, in some alternative implementations, the functions/acts noted might occur out of the order noted in the figures. For example, two figures shown in succession may in fact be executed substantially concurrently or may sometimes be executed in the reverse order, depending upon the functionality/acts involved. The term "or" is to be interpreted as inclusive unless indicated otherwise.

The terms "high" and "low", when referring to logic states, mean a high logic value, which typically is a binary one, and a low logic value, which is a binary zero.

According to certain embodiments of the present invention, an electronic circuit comprises a protected module having functional registers, a master module that writes/reads data to/from the functional registers, and a protection module that prevents unintended write operations by the master module to the functional registers. The protection module includes soft lock bits (SLBs) corresponding to the functional registers, where, if an SLB is set, then the corresponding functional register is locked. The protection module also includes control logic that supports (a) a page select (PS) control parameter that indicates whether access by the master module is to the functional registers or to the SLBs and (b) a mode select (MS) control parameter that indicates whether access by the master module to the functional registers is in a normal access mode in which each written-to functional register is left unlocked or an auto-lock access mode in which each written-to functional register is locked by setting the corresponding SLB.

Figure 3:
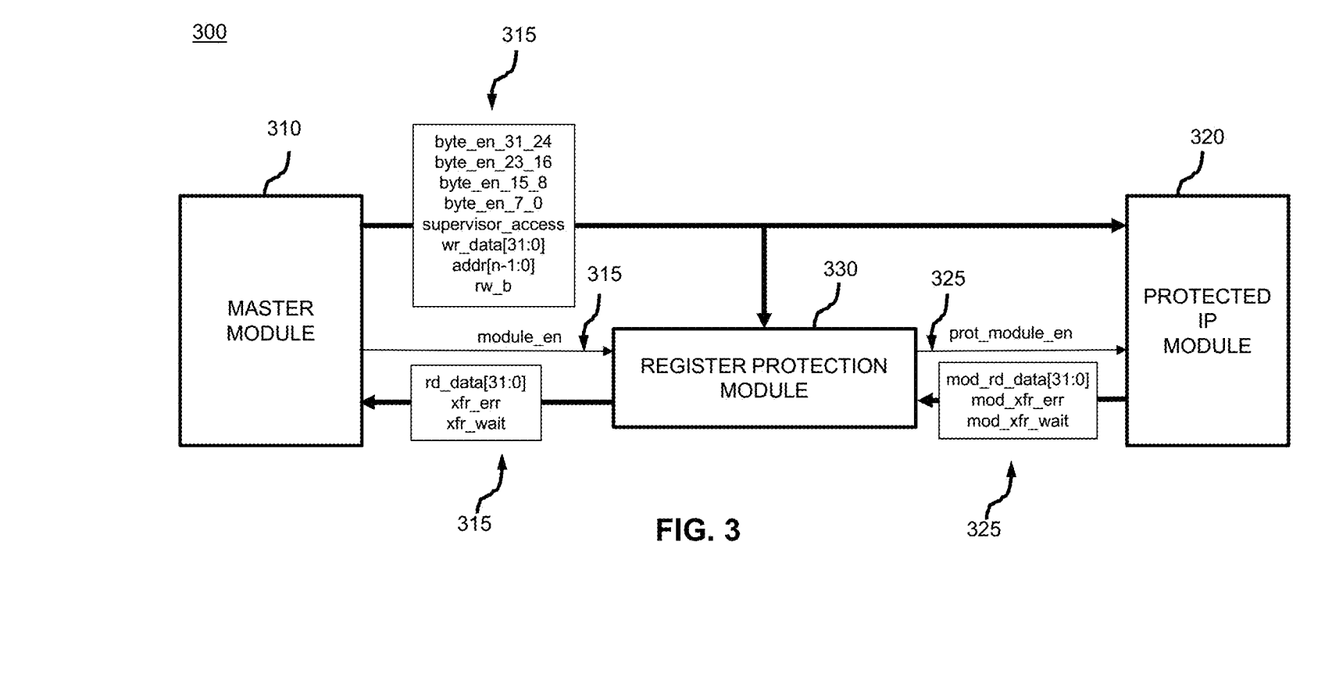
FIG. 3 is a simplified block diagram of an electronic circuit according to one embodiment of the present invention.

Referring now to FIG. 3, a simplified block diagram of an electronic circuit 300 according to one embodiment of the present invention is shown. Like the conventional electronic circuit 100 of FIG. 1, the electronic circuit 300 has a master module 310, an access bus 315, a protected hardware IP module 320, a dedicated bus 325, and a register protection module 330, all of which are, at a generic functional level, analogous to the corresponding components of the electronic circuit 100. In particular, like the protection module 130 of FIG. 1, the protection module 330 functions to prevent the master module 310 from performing unintended write operations to functional registers in the protected module 320. The circuit 300 may comprise a System on a Chip (SOC) having multiple cores, multiple memories, multiple accelerators, and a complex interconnection scheme.

Although FIG. 3 shows only one master module 310, only one protected module 320, and only one protection module 330, in general, the electronic circuit 300 may have one or more of each, where, for example, each master module 310 may access more than one protected module 320, each protected module 320 may be accessed by different master modules 310, but by only one master module 310 at a time, and each protection module 330 may protect more than one protected module 320. Note, however, that each protected module 320 is protected by only one protection module 330.

As indicated in FIG. 3 and as described in further detail below, one difference between the circuit 300 and the conventional circuit 100 is that, in the circuit 300, the addresses used for read and write operations to functional registers in the protected module 320 never need to be translated. As such, the address addr is available on the access bus 315 for use by the protected module 320 as well as by the protection module 330. Note that the width of the addr bus of the access bus 315 in the circuit 300 is 2 bits smaller than the width of the addr bus of the access bus 115 in the circuit 100. As described further below, other differences between the circuit 300 and the conventional circuit 100 exist within the protection module 330.

The access bus 315 is used to access the protected module 320 and the protection module 330. The following signals are transmitted over the access bus 315, in one possible implementation, as shown in FIG. 3:

One-bit module enable signal module_en indicates whether the protected module 320 or the protection module 330 is being accessed;
One-bit byte enable signals byte_en_31_24, byte_en_23_16, byte_en_15_8, and byte_en_7_0 enable individual byte selection during an access;
One-bit supervisor access signal supervisor access indicates whether supervisor or user access is selected;
Data to be written wr_data is provided by a 32-bit write data bus;
Address addr[n−1:0] is provided via an n-bit address bus;
One-bit read and write bar signal rw_b indicates access type (e.g., 1=read, 0=write);
Read data rd_data is provided by a 32-bit read data bus;
One-bit transfer error signal xfr_err indicates whether the access is invalid and no write or read operation is performed; and
One-bit transfer wait signal xfr_wait indicates whether access cannot be completed in the current clock cycle.

The signals prot_module_en, mod_rd_data, mod_xfr_err, and mod_xfr_wait on the dedicated bus 325 are analogous to the corresponding signals on the access bus 315.

Note that the signals shown in FIG. 3 being transmitted on the access bus 315 and the dedicated bus 325 correspond to one possible implementation of the circuit 300. Other implementations may transmit one or more of those signals on different busses and/or one or more other signals on those busses.

In certain implementations, the circuit 300 can be (but does not have to be) provisioned using a conventional master module such as the master module 110 of FIG. 1 for the master module 310 of FIG. 3 and/or a conventional protected module such as the protected module 120 of FIG. 1 for the protected module 320 of FIG. 3. Although there need not be any hardware differences between the master module 310 and the master module 110, the software executed by the master module 310 will be different from the software executed by the master module 110 to take into account differences between the protection module 330 and the protection module 130. Note that there need not be any differences between the hardware and the software of the protected modules 120 and 320.

Figure 4:
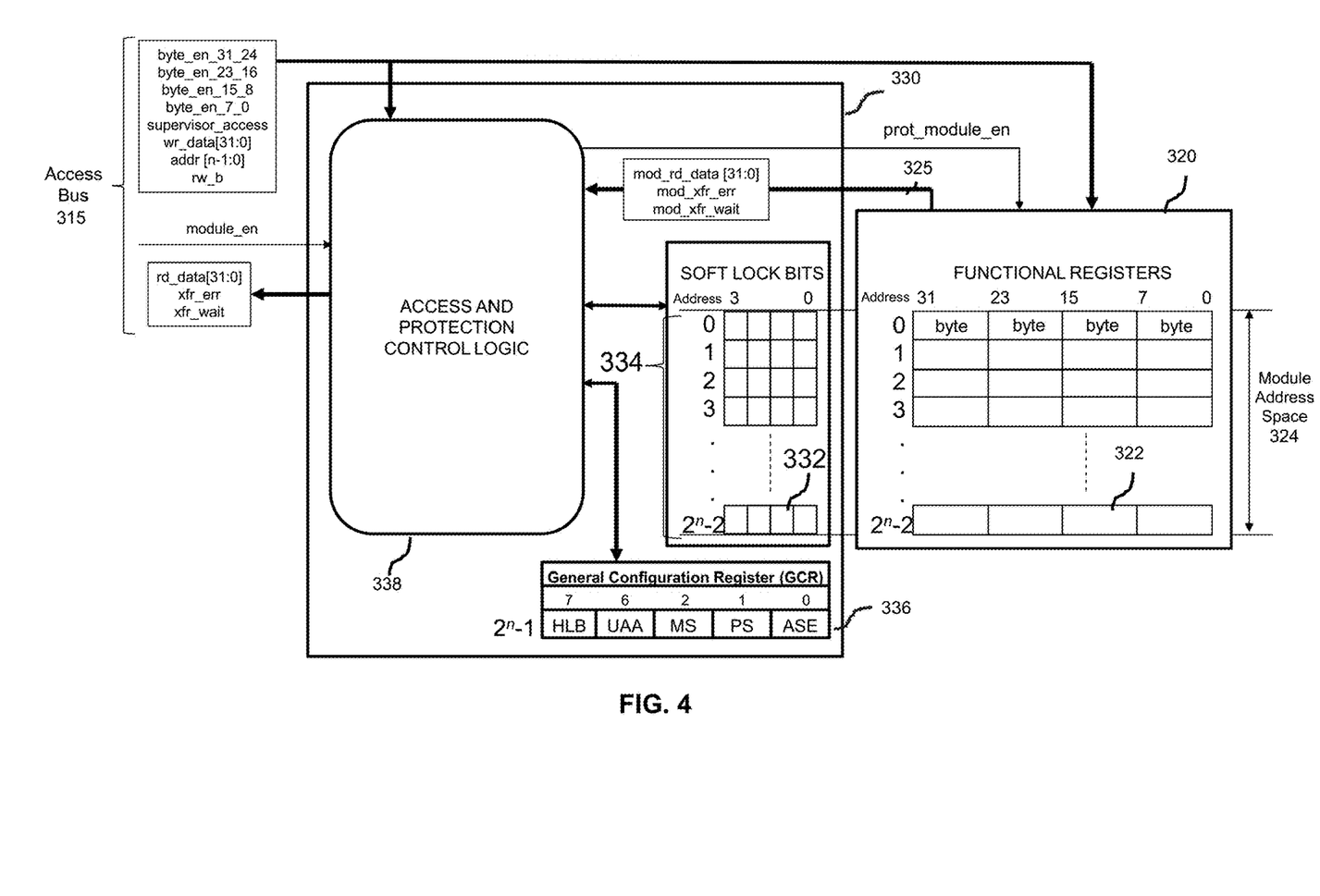
FIG. 4 is a simplified block diagram showing implementation details for the IP module and the protection module of FIG. 3.

FIG. 4 is a simplified block diagram showing implementation details for the protected module 320 and for the protection module 330.

As shown in FIG. 4, the protected module 320 has up to $2^{n+2}-4$ byte-size functional registers 322 in a functional module address page 324 having addresses that range from 0 to $2^n-2$, where n is an integer and there are four different byte-size functional registers 322 at each address location. The protection module 330 has up to $2^{n+2}-4$ SLBs 332 in an SLB address page 334 having the same addresses ranging from 0 to $2^n-2$, where there are four different 1-bit SLBs 332 at each address location, and each SLB 332 has the same address as its corresponding functional register 322.

The reason why there are only $2^n-1$ addresses in the functional module and SLB pages 324 and 334 instead of $2^n$ is that the protection module 330 stores its control parameters in a GCR 336 at address $2^n-1$, so that the memory map for the functional registers 322, the SLBs 332, and the GCR 336 can all share a single block of 2n addresses. Note that, in other implementations, a different address can be used for the GCR 336.

In addition to the SLBs 332 and the GCR 336, the protection module 330 also has access and protection control logic 338, which controls the operations of the protection module 330.

As shown in FIG. 4, the byte-size GCR 336 stores the following five different control parameters:
1-bit Hard Lock Bit (HLB) Control Parameter;
1-bit User Access Allowed (UAA) Control Parameter;
1-bit Mode Select (MS) Control Parameter;
1-bit Page Select (PS) Control Parameter; and
1-bit Automatic Page Switching Enable (ASE) Control Parameter.

The three other bits in the GCR 336 are undefined.

An HLB value of 0 implies that all SLBs 332 are accessible and can be modified. An HLB value of 1 implies that all SLBs 332 are write protected and cannot be modified by any (software) means. HLB cannot be cleared once it is set; it can be cleared only by a hardware reset.

A UAA value of 0 implies that the functional registers 322 in the protected module 320 as well as the SLBs 332 and the GCR 336 in the protection module 330 can be written to only in supervisor mode. A UAA value of 1 implies that the functional registers 322 in the protected module 320 can be accessed as per the accessibility defined by the protected module 320 along with the SLBs 332 and the GCR 336 in the protection module 330 in both user and supervisor modes.

The present invention virtually creates two pages in the same address space: (i) a functional register page 324 corresponding to the functional registers 322 in the protected module 320 and (ii) an SLB page 334 corresponding to the SLBs 332 in the protection module 330. The PS control parameter selects either the functional page or the SLB page for read and write operations. A PS value of 0 implies that the functional register page is selected. A PS value of 1 implies that the SLB page is selected. Note that setting and resetting an SLB are essentially two different write operations to the SLB. The GCR 336 does not belong to any page. When the GCR 336 is accessed (read or write), the PS value is ignored.

The MS control parameter selects the access mode when the functional register page is the selected page (i.e., PS=0). An MS value of 0 implies that the normal access mode is selected, such that writing to an unlocked functional register 322 leaves the corresponding SLB 332 reset and the functional register 322 unlocked. An MS value of 1 implies that the auto-lock access mode is selected, such that writing to an unlocked functional register 322 results in the corresponding SLB 332 being set and the functional register 322 being locked. When either the SLB page (i.e., PS=1) or the GCR 336 is accessed, the MS value is ignored.

An ASE value of 0 implies that automatic page switching is disabled. An ASE value of 1 implies that automatic page switching is enabled. As described further below in the context of FIG. 9, if automatic page switching is enabled, then, whenever an SLB 332 is written (normally reset), the protection module 330 automatically resets the PS control parameter to 0 such that the next command will be issued to a functional register, typically the functional register 322 corresponding to that written (normally reset) SLB 332. In addition, with automatic page switching enabled, whenever a write command to a functional register 322 is executed, the protection module 330 automatically sets the PS control parameter to 1 such that the next command can be a command to write (normally reset) another SLB 332. The PS control parameter is toggled only during a write command. A read command to either the SLB page or the functional register page or any access to the GCR address does not toggle the PS control parameter. Access to the GCR 336 is PS agnostic.

Automatic page switching reduces the number of commands required to write to a previously locked functional register 322 from four commands to only two commands. If automatic page switching is disabled (ASE=0), in order to write to a previously locked functional register 322 (after having just written data to a different unlocked functional register 322), the following four commands are executed:

Command No. 1: Set PS=1 to select SLB page;
Command No. 2: Reset the corresponding SLB 332 to unlock the functional register 322;
Command No. 3: Set PS=0 to select the functional register page; and
Command No. 4: Write data to the unlocked functional register 322.

If, however, automatic page switching is enabled (ASE=1), in order to write to a previously locked functional register 322 (after having just written data to a different unlocked functional register 322), only the following two commands are executed:

Command No. 1: Reset the corresponding SLB 332 to unlock the functional register 322 after which PS is automatically reset to 0 to select the functional register page; and
Command No. 2: Write data to the unlocked functional register 322 after which PS is automatically set to 1 to select the SLB page.

By automatically toggling PS between 1 and 0, a sequence of write operations to previously locked functional registers can be executed using only two commands per write operation.

Figure 5:
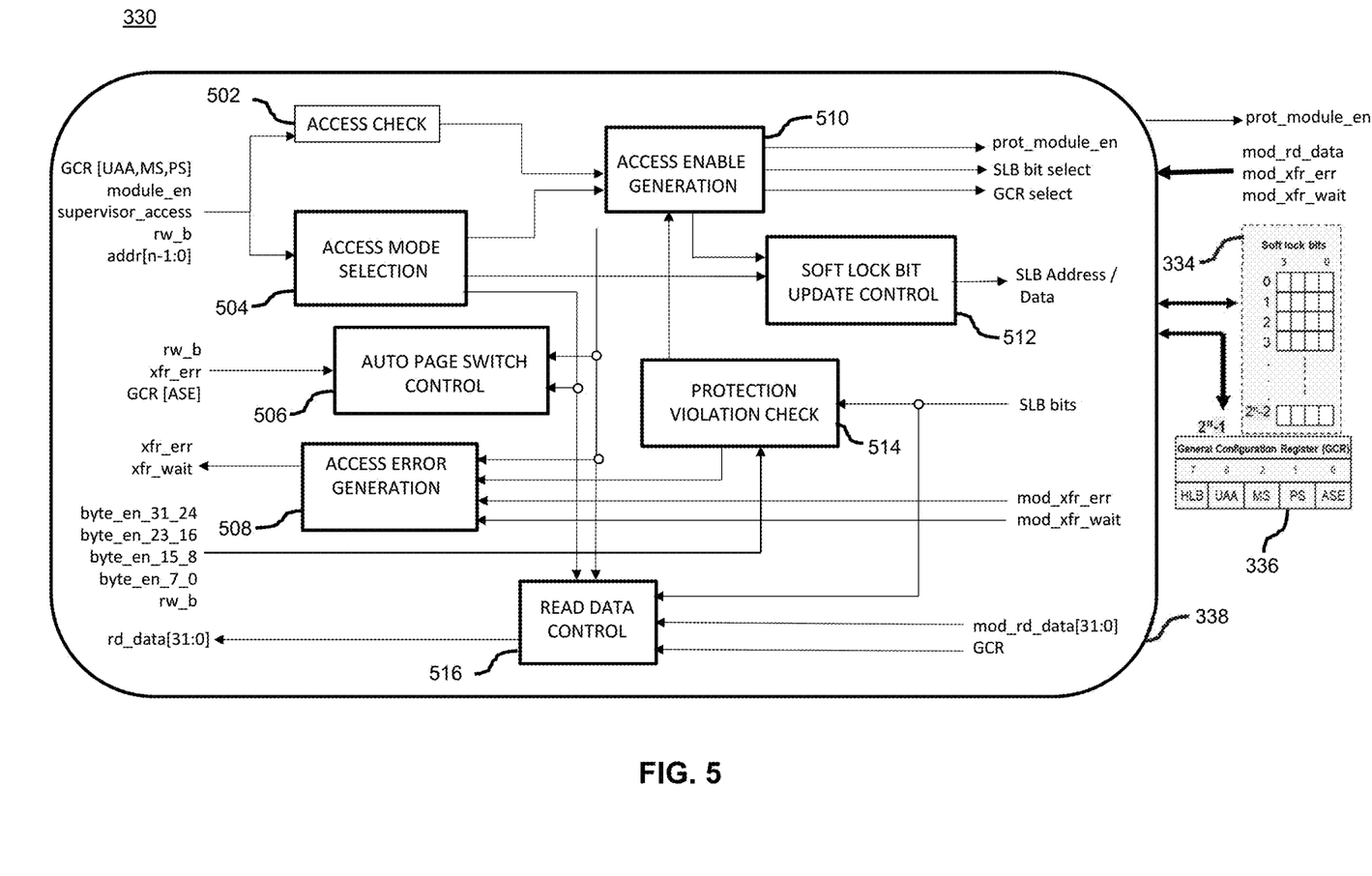
FIG. 5 is a simplified block diagram of the protection module of FIGS. 3 and 4 showing implementation details for the control logic of FIG. 4.

FIG. 5 is a simplified block diagram of the protection module 330 of FIGS. 3 and 4 showing implementation details for the control logic 338 of FIG. 4.

The access check sub-module 502 validates the access from the master module 310 and generates authentication control for the other sub-modules in the protection module 330. The access check sub-module 502 uses signals supervisor access, rw_b, and module_en from access bus 315, a control parameter UAA from GCR 336.

An access error is indicated in a write operation if none of the following conditions are met:
1) Access is in supervisor mode (i.e., supervisor access is 1)
2) Access is in user mode (i.e., supervisor access is 0) but user access is allowed (i.e., the control parameter UAA is 1)

The access mode selection sub-module 504 determines the accessed resources and the access modes. The resources are the protected module 320, the GCR 336, and the SLBs 332. The access modes for the protected module 320 are the normal access mode and the auto-lock access mode. The access mode selection sub-module 504 uses the address bus addr from the access bus 315 and the control parameters PS and MS from the GCR 336. The access mode selection sub-module 504 generates control to the access enable generation sub-module 510, the soft lock bit update control sub-module 512, and the read data control sub-module 516 to work. The mode is selected on the following conditions:
1) The auto-lock access mode is declared when PS=0, MS=1, and the master module 310 is not accessing the GCR 336.
2) The normal access mode is declared when PS=0, MS=0, and the master module 310 is not accessing the GCR 336.

The auto page switch control sub-module 506 validates the automatic page switching conditions and helps toggling of the PS control parameter in the GCR 336 at the required instant. The auto page switch control sub-module 506 receives input from the access enable generation sub-module 510, the access mode selection sub-module 504, the signals rw_b and xfr_err from the access bus 315, and a control parameter ASE from GCR 336.

When the access error generation sub-module 508 determines that the master module 310 transmitted a write command for a locked functional register 322 by determining that the corresponding SLB 332 is set, the access error generation sub-module 508 prevents the write command from being executed and transmits an error message via the xfr_err signal to the master module 310. The access error generation sub-module 508 also provides an error message when the access check sub-module 502 indicates an unauthorized access or any write command for an SLB 332 when the hard lock bit HLB control parameter of the GCR 336 is set.

The access enable generation sub-module 510 generates the actual enable signals for the protected module 320, the SLBs 332, and the GCR 336. The access enable generation sub-module 510 receives inputs from the access check sub-module 502, the access mode selection sub-module 504, and the protection violation check sub-module 514.

The soft lock bit update control sub-module 512 generates the values of the SLB bits to be updated when a write command is issued by the master module 310 either to write to any protected functional register 322 in the protected module 320 or to write SLB bits at an address to reset or set the SLB 332. The soft lock bit update control sub-module 512 receives outputs from the access mode selection sub-module 504 and the access enable generation sub-module 510.

The protection violation check sub-module 514 detects a protection violation when a write command is issued to a locked functional register 322 by determining that the corresponding SLB 332 is set and indicates this result to the access enable generation sub-module 510 and the access error generation sub-module 508 which disables the prot_module_en signal and generates the access error signal xfr_err to the master module 310, respectively.

The read data control sub-module 516 generates the read data rd_data of the access bus 315 in response to a read command from the master module 310 based on the page selection parameter PS from the GCR 336 and the addr signal from the access bus 315. The read data control sub-module 516 receives inputs from the access enable generation sub-module 510, the GCR 336, the read data output mod_rd_data from the protected module 320, and the SLB bits 332.

Figure 6:
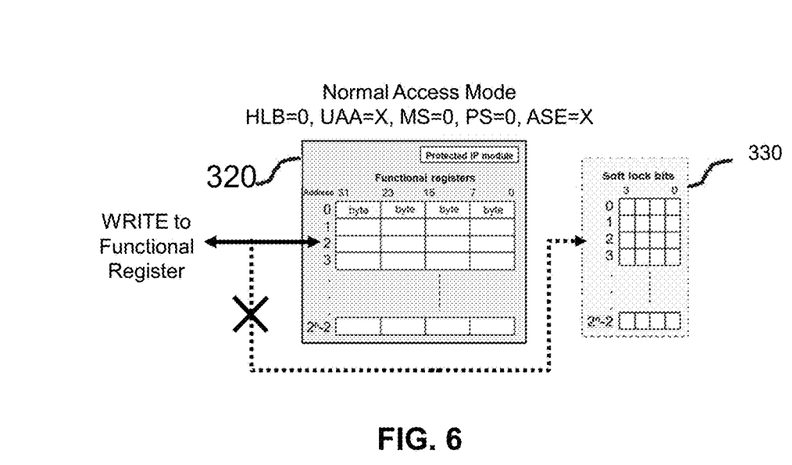
FIG. 6 is a representation of the processing involved in writing to an unlocked functional register in the IP module of FIG. 3 in the normal access mode.

FIG. 6 is a representation of the processing involved in writing to an unlocked functional register in the protected module 320 (i.e., PS=0) in the normal access mode (i.e., MS=0). In that case, data is written to the functional register without setting the corresponding SLB in the protection module 330.

Figure 7:
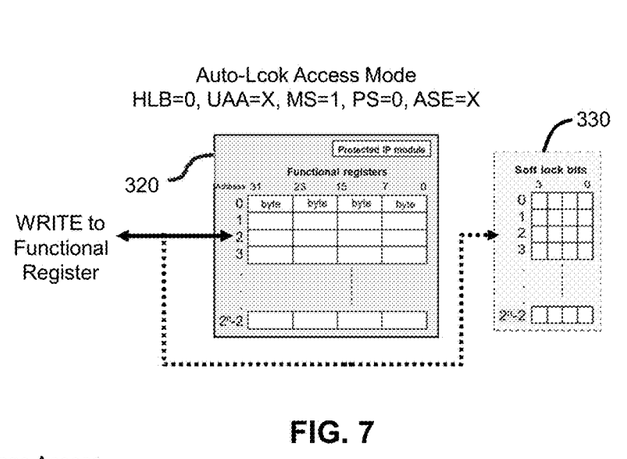
FIG. 7 is a representation of the processing involved in writing to an unlocked functional register in the IP module of FIG. 3 in the auto-lock access mode.

FIG. 7 is a representation of the processing involved in writing to an unlocked functional register in the protected module 320 (i.e., PS=0) in the auto-lock access mode (i.e., MS=1). In that case, after data is written to the functional register, the corresponding SLB in the protection module 330 is set to lock the functional register.

Figure 8:
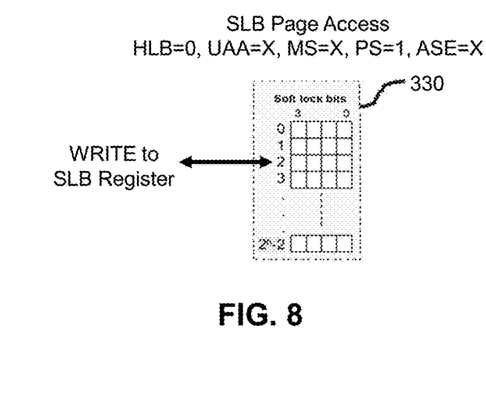
FIG. 8 is a representation of the processing involved in writing to an SLB in the protection module of FIG. 3.

FIG. 8 is a representation of the processing involved in writing to (i.e., setting or resetting) an SLB in the protection module 330 (i.e., PS=1). In that case, a 1 or a 0 is written to the SLB.

Figure 9:
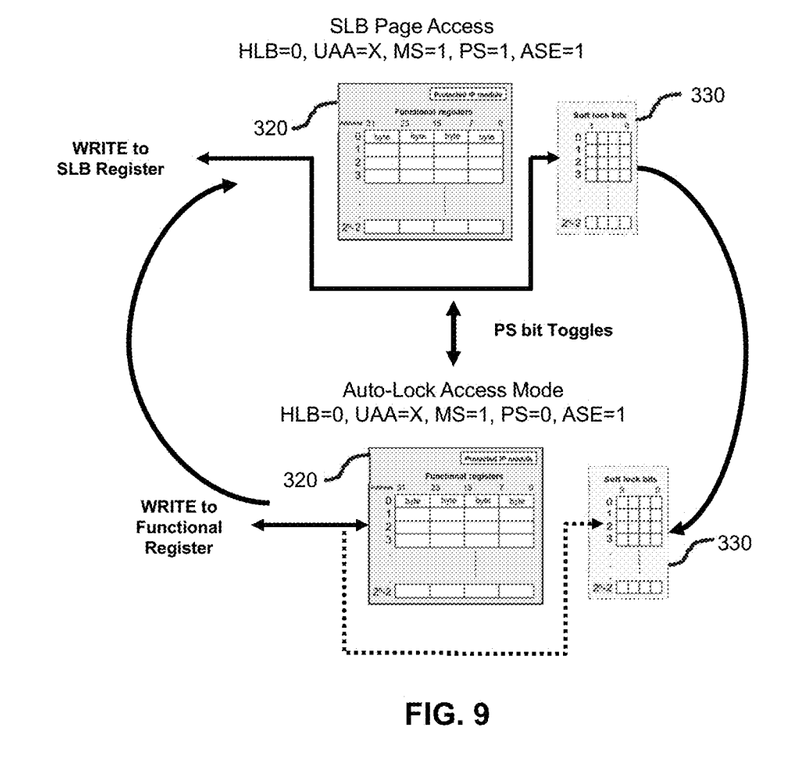
FIG. 9 is a representation of the processing involved in writing to a sequence of locked functional registers in the IP module of FIG. 3 with automatic page switching enabled and the auto-lock access mode selected.

FIG. 9 is a representation of the processing involved in writing to a sequence of locked functional registers in the protected module 320 with automatic page switching enabled (i.e., ASE=1) and the auto-lock access mode selected (i.e., MS=1). In that case, in a first step for any locked functional register, with the SLB page selected (i.e., PS=1), the corresponding SLB in the protection module 330 is reset and the PS control parameter is automatically toggled to 0, thereby selecting the functional register page. In a second step, data is written to the now-unlocked functional register in the protected module 320, the corresponding SLB is set to re-lock the functional register, and the PS control parameter is automatically toggled back to 1, thereby selecting the SLB page to repeat the process for writing to the next locked functional register, and so on.

Note that, if automatic page switching is enabled (i.e., ASE=1) and the normal access mode is selected (i.e., MS=0), then the processing will be the same as that shown in FIG. 9, except that the SLB for the just-written-to functional register will not be automatically set, thereby leaving the functional register unlocked.

Figure 10:
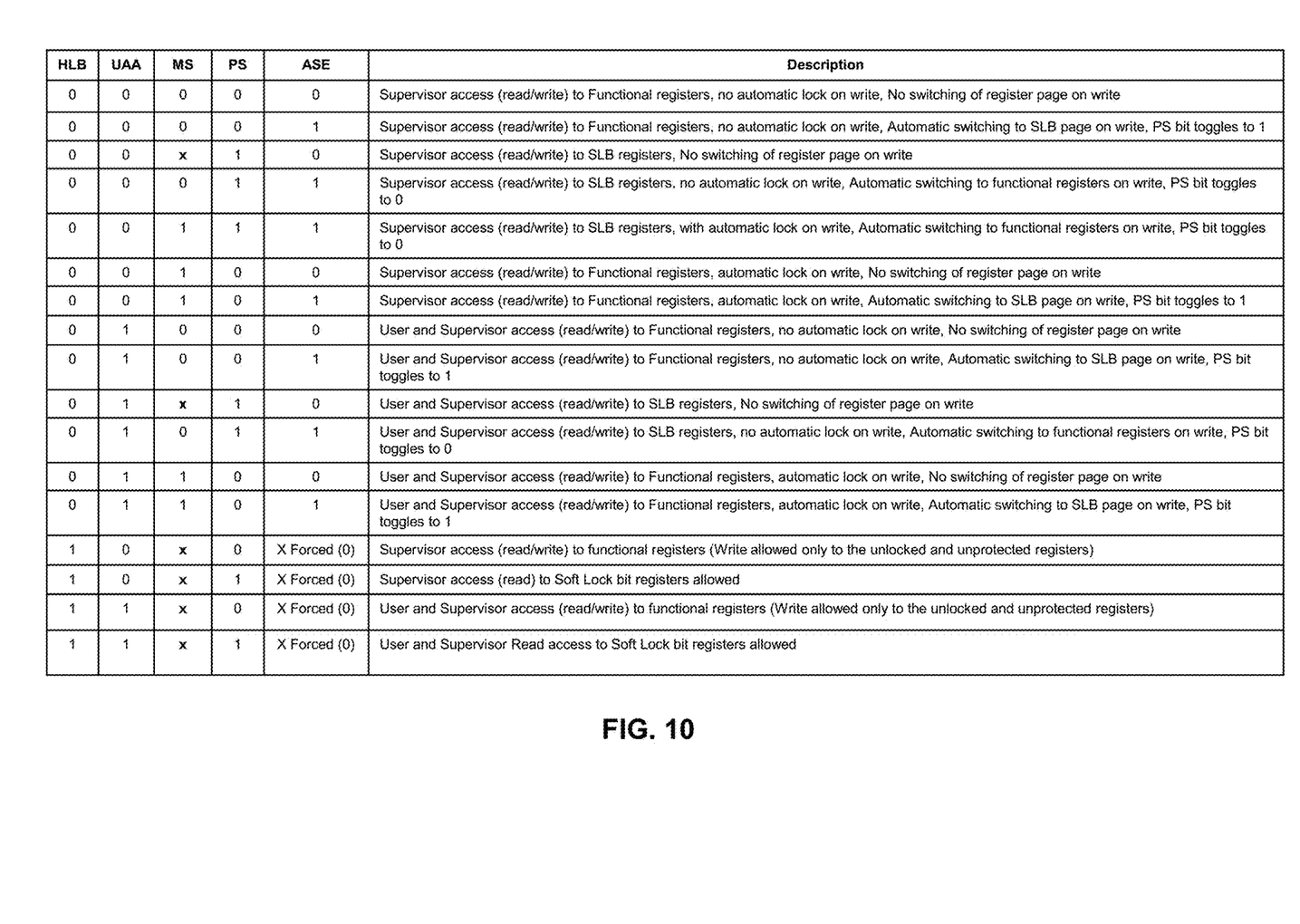
FIG. 10 is a table that shows the different operating modes for the protection module of FIG. 3 for the different combinations of control parameters stored in the GCR of FIG. 4.

FIG. 10 is a table that describes the different operating modes for the protection module 330 of FIG. 3 for the different combinations of control parameters stored in the GCR 336 of FIG. 4.

Figure 11:
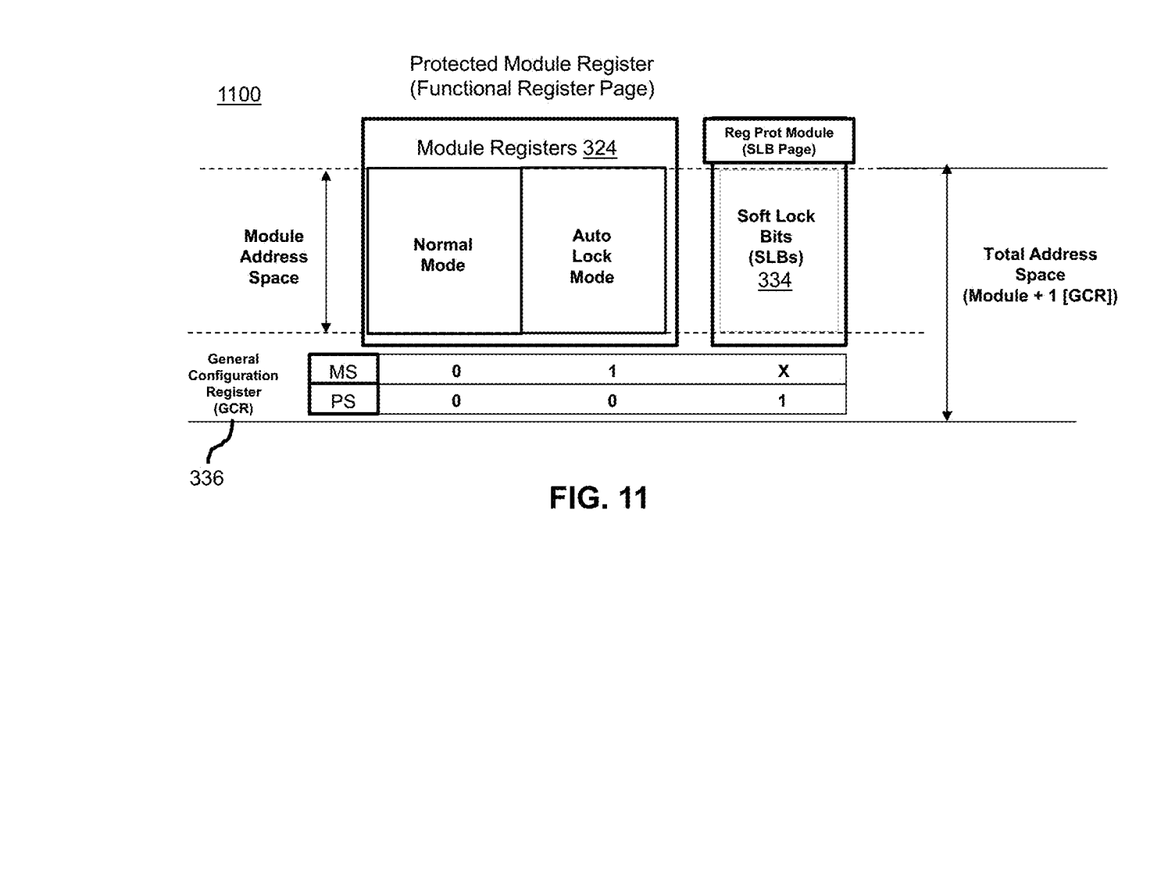
FIG. 11 is a representation of a memory map for one possible implementation of the IP module and the protection module of FIG. 3.

FIG. 11 is a representation of a memory map 1100 for one possible implementation of the protected module 320 and the protection module 330 of FIG. 3. As represented in FIG. 11, the memory map 1100 associated with the circuit 300 has only one block of addresses as compared to the memory map 200 of FIG. 2 for the conventional circuit 100 of FIG. 1, which has four blocks of addresses.

Three different features of the circuit 300 enable the relative reduced size of the memory map 1100. First, the addition of the MS control parameter to indicate selection of either the normal access mode or the auto-lock access mode eliminates the need for the mirrored address space 220 of FIG. 2. Second, the addition of the PS control parameter to indicate whether the selected page is the functional register page 324 or the SLB page 334 enables the functional registers and their corresponding SLBs to share the same addresses, thereby eliminating the SLB address space 230 of FIG. 2. Third, limiting the maximum size of the functional registers in order to reserve one address for the GCR 336 eliminates the need for the GCR address space 240 of FIG. 2.

As a result, the entire memory map 1100 for the protected module 320 and the protection module 330 can be equal to the address space needed for the functional registers plus one additional address for the GCR 336. For example, if the functional registers are limited to an address space of 1 KB-4B, then the entire memory map 1100 can be 1 KB. If the functional registers are limited to an address space of 2 KB-4B, then the entire memory map 1100 can be 2 KB. And if the address space for the functional registers is as large as 32 KB-4B, then the entire memory map 1100 can be 32 KB.

The circuit 300 is immune to the address space size and does not need the address space of protected module 320 to be aligned to an integer power of 2. For example, if the protected module 320 has 155 address locations, then the circuit 300 can be implemented with 156 address locations, where 155 are for the functional registers and the corresponding SLBs and one is for the GCR.

Although the invention has been described in the context of electronic systems in which each SLB corresponds to an 8-bit functional register, in general, each SLB can correspond to a functional register having a size equal to $2^n$ bytes, where n is a non-negative integer.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

It should be understood that the steps of the exemplary methods set forth herein are not necessarily required to be performed in the order described, and the order of the steps of such methods should be understood to be merely exemplary. Likewise, additional steps may be included in such methods, and certain steps may be omitted or combined, in methods consistent with various embodiments of the invention.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

The invention claimed is:

1. An electronic circuit, comprising:
 a protected module having functional registers;
 a master module that writes data to and reads data from the functional registers; and
 a protection module that prevents unintended write operations by the master module to the functional registers, wherein the protection module comprises:
  soft lock bits (SLBs) corresponding to the functional registers, wherein, if an SLB is set, then the corresponding functional register is locked; and
  control logic that supports:
   a page select (PS) control parameter that indicates whether access by the master module is to the functional registers or to the SLBs,
   a mode select (MS) control parameter that indicates whether access by the master module to the functional registers is in a normal access mode in which each written-to functional register is left unlocked or an auto-lock access mode in which each written-to functional register is locked by setting the corresponding SLB, and an automatic page switching enable (ASE) control parameter that indicates whether the PS control parameter is automatically toggled to the functional registers after a write operation to an SLB and to the SLBs after a write operation to a functional register.

2. The circuit of claim 1, wherein:

each functional register has a single address for both the normal access mode and the auto-lock access mode; and the address for each functional register is the same as the address for its corresponding SLB.

3. The circuit of claim 2, wherein:

the addresses for the functional registers and the SLBs fit into an integer number of address blocks; and an address in the integer number of address blocks is used for a general configuration register (GCR) that stores the PS and MS control parameters.

4. The circuit of claim 1, wherein the PS and MS control parameters are one-bit values.

5. The circuit of claim 1, wherein the ASE control parameter is a one-bit value.

6. The circuit of claim 1, wherein:

the master module, the protected module, and the protection module communicate via an access bus; and the protected module and the protection module communicate via a dedicated bus, wherein the master module transmits the address of a functional register to be written to via the access bus.

7. The circuit of claim 6, wherein no address translation is performed for the master module to write to a functional register in either the normal access mode or the auto-lock access mode.

8. The circuit of claim 1, wherein a memory map for the protection module and the protected module comprises a single address space for both the functional registers in the auto-lock access mode and the functional registers in the normal access mode.

9. The circuit of claim 8, wherein each functional register and its corresponding SLB have a common address in the single address space of the memory map.

10. The circuit of claim 1, wherein the single address space of the memory map further comprises an address for a GCR that stores the control parameters for the control logic.

11. An electronic circuit comprising:

a protected module having functional registers;

a master module that writes data to and reads data from the functional registers;

a protection module that prevents unintended write operations by the master module to the functional registers, wherein the protection module comprises:

soft lock bits (SLBs) corresponding to the functional registers, wherein, if an SLB is set, then the corresponding functional register is locked, and control logic that supports:

a page select (PS) control parameter that indicates whether access by the master module is to the functional registers or to the SLBs, and a mode select (MS) control parameter that indicates whether access by the master module to the functional registers is in a normal access mode in which each written-to functional register is left unlocked or an auto-lock access mode in which each written-to functional register is locked by setting the corresponding SLB, wherein each functional register has a single address for both the normal access mode and the auto-lock access mode, the address for each functional register is the same as the address for its corresponding SLB, the addresses for the functional registers and the SLBs fit into an integer number of address blocks, the control logic further supports an automatic page switching enable (ASE) control parameter that indicates whether or not the PS control parameter is automatically toggled to the functional registers after a write operation to an SLB and to the SLBs after a write operation to a functional register, an address in the integer number of address blocks is used for a general configuration register (GCR) that stores the PS, MS, and ASE control parameters, the PS, MS, and ASE control parameters are one-bit values, the master module, the protected module, and the protection module communicate via an access bus of the system, the protected module and the protection module communicate via a dedicated bus, wherein the master module transmits the address of a functional register to be accessed via the access bus, no address translation is performed for the master module to write to a functional register in either the normal access mode or the auto-lock access mode, a memory map for the protection module and the protected module comprises a single address space for both the functional registers in the auto-lock access mode and the functional registers in the normal access mode, each functional register and its corresponding SLB have a common address in the single address space of the memory map, and the single address space of the memory map further comprises an address for a GCR that stores the control parameters for the control logic.

* * * * *